(12) United States Patent
Emerson et al.

(10) Patent No.: US 10,727,116 B2
(45) Date of Patent: Jul. 28, 2020

(54) PROGRAMMING REACTIVE COMPONENTS

(71) Applicant: Texas Instruments Incorporated, Dallas, TX (US)

(72) Inventors: Paul Merle Emerson, Madison, AL (US); Benjamin Stassen Cook, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/048,821

(22) Filed: Jul. 30, 2018

(65) Prior Publication Data

US 2020/0035550 A1 Jan. 30, 2020

(51) Int. Cl.

| H01L 21/768 | (2006.01) |
|---|---|
| H01L 27/02 | (2006.01) |
| H01L 21/66 | (2006.01) |
| H01L 21/78 | (2006.01) |
| H01L 23/522 | (2006.01) |

(52) U.S. Cl.
CPC .. *H01L 21/76838* (2013.01); *H01L 21/76801* (2013.01); *H01L 21/78* (2013.01); *H01L 22/12* (2013.01); *H01L 22/14* (2013.01); *H01L 23/5223* (2013.01); *H01L 23/5227* (2013.01); *H01L 23/5228* (2013.01); *H01L 27/0207* (2013.01)

(58) Field of Classification Search
CPC ... H01L 21/76838; H01L 21/78; H01L 22/12; H01L 21/76801; H01L 23/5227; H01L 27/0207; H01L 23/5223; H01L 23/5228; H01L 22/14

USPC .......................................................... 257/529
See application file for complete search history.

(56) References Cited

U.S. PATENT DOCUMENTS

| 2001/0018987 | A1 | 9/2001 | Tzanavaras et al. |
|---|---|---|---|
| 2006/0103554 | A1 | 5/2006 | Jones |
| 2007/0075398 | A1 | 4/2007 | Male |
| 2007/0203661 | A1 | 8/2007 | John et al. |
| 2008/0266787 | A1 | 10/2008 | Gosset et al. |
| 2010/0167427 | A1 | 7/2010 | Howard et al. |
| 2011/0057718 | A1 | 3/2011 | Snoeij et al. |
| 2011/0248772 | A1 | 10/2011 | Neidorff |
| 2014/0177456 | A1 | 6/2014 | Boudreau et al. |
| 2015/0249453 | A1 | 9/2015 | Harrington et al. |
| 2016/0004269 | A1 | 1/2016 | Ivanov |
| 2016/0379960 | A1 | 12/2016 | Huang et al. |
| 2017/0047297 | A1* | 2/2017 | Wang ................ H01L 23/53295 |
| 2017/0149397 | A1 | 5/2017 | Roy et al. |
| 2017/0288622 | A1 | 10/2017 | Tan et al. |
| 2018/0151463 | A1 | 5/2018 | Venugopal et al. |

OTHER PUBLICATIONS

International Search Report for PCT/US2019/044207 dated Oct. 24, 2019.

* cited by examiner

*Primary Examiner* — Caleen O Sullivan
(74) *Attorney, Agent, or Firm* — Michael A. Davis, Jr.; Charles A. Brill; Frank D. Cimino

(57) ABSTRACT

Electronic device manufacturing and configuration methods include performing an additive deposition process that deposits a conductive, resistive, magnetic, semiconductor and/or thermally conductive material over a surface of a processed wafer metallization structure to set or adjust a circuit of a capacitor, an inductor, a resistor, an antenna and/or a thermal component of the metallization structure.

17 Claims, 12 Drawing Sheets

PROGRAMMING REACTIVE COMPONENTS

BACKGROUND

Analog and digital circuits can be adjusted during manufacturing to set circuit performance parameters and/or to change circuit configurations. Fuses, electrically erasable programmable read-only memory (EEPROM) and one-time programmable (OTP) memories can be used for trimming and/or programmed different product options during manufacturing of microelectronic devices. However, those memory elements and/or fuses often require extra masking steps and more die area, cost and complexity, which limit product flexibility and reliability, and/or which require precision special multiple pass test and programming procedures to ensure reliability.

SUMMARY

Electronic device manufacturing and configuration methods include performing an additive deposition process that deposits a material over a surface of a processed wafer metallization structure to set or adjust a circuit of a capacitor, an inductor, a resistor, an antenna and/or a thermal component of the processed wafer.

DETAILED DESCRIPTION

Figure 1:
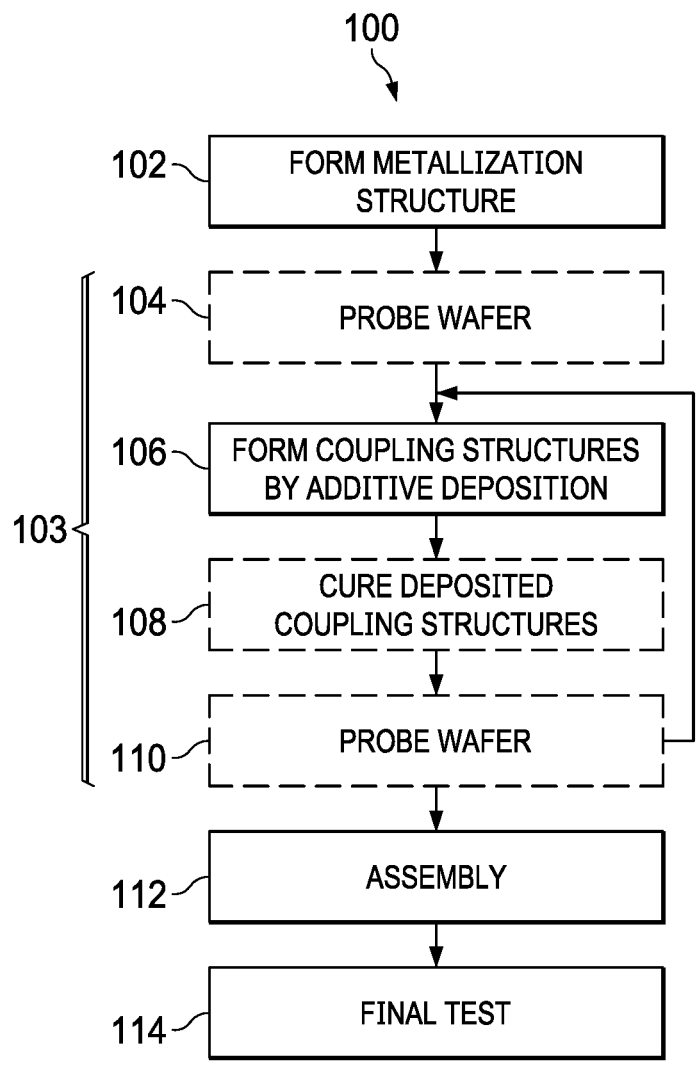
FIG. 1 is a flow diagram of a method of manufacturing a microelectronic device.

In the drawings, like reference numerals refer to like elements throughout, and the various features are not necessarily drawn to scale. Also, in this description, the term "couple" or "couples" includes indirect or direct electrical or mechanical connection or combinations thereof. For example, if a first device, component or structure couples to or is coupled with a second device, structure or component, that connection may be through a direct electrical connection, or through an indirect electrical connection via one or more intervening structures, devices and/or connections.

FIG. 1 shows a method 100 of manufacturing and configuring a microelectronic device, such as a microelectronic device having an integrated circuit (IC). Unlike fuses, EEPROMs or OTP memories, the method 100 uses printing or other additive deposition processing to form material structures over a surface (e.g., a top surface) of a metallization structure of a processed wafer (such as a silicon wafer or silicon-on-insulator ("SOI") wafer) to set or adjust a circuit of electronic components of the wafer. Examples of the described methods are useful during manufacturing to set or adjust values or parameters associated with one or more components formed in the metallization structure. The described examples are useful for adjusting reactive or other electronic components in a variety of analog circuit trimming applications, including RF circuits, transformer circuits, thermal circuits, etc.

The method 100 includes fabricating a wafer with a metallization structure at 102 and configuring circuitry of electronic components of the processed wafer at 103, before final assembly and packaging. The wafer fabrication at 102 includes forming electronic components on or in a semiconductor substrate, and metallization processing to form a metallization structure over the substrate with further electronic components or portions thereof. The metallization processing includes forming one or more dielectric layers with conductive routing structures connected to and/or forming one or more of the electronic components to provide a processed wafer. The metallization structure provides a top surface of the wafer that exposes some conductive routing structures for subsequent bondwire connections and for ohmic connection to subsequently deposited material structures. The metallization structure's top surface is not required to be planar. In some examples, the top surface exposes a conductive routing structure of an upper-most metallization layer. The wafer fabrication at 102 includes forming a passivation layer (e.g., oxide, oxynitride, polyamide, nitride material, etc.) over select portions of the surface of the wafer. Subsequent additive deposition processing creates material structures that can electrically connect to exposed conductive routing structures and/or that can overly such structures with intervening passivation layer materials. A passivation layer covers select portions of the top surface and leaves portions of the conductive routing structures exposed.

The example method 100 includes a circuit configuration method 103 as part of the manufacturing process. The configuration processing at 103 includes configuring (e.g., setting or adjusting) circuitry of the electronic components of the processed wafer using additive deposition. The configuration includes setting or adjusting a value of an electronic component and/or setting or adjusting circuit configurations and/or connections. Examples include creating or modifying capacitive or magnetic coupling between components or conductive features of components, creating or modifying series and/or parallel connections of components or features thereof, creating or modifying antenna structures, creating or modifying thermal conduction paths in a thermal circuit, etc.

The configuration processing at 103 includes performing a first wafer probe test at 104 that measures a parameter of the circuitry of at least one electronic component. The processed wafer includes multiple die areas or regions that will ultimately be singulated into separate integrated circuit dies for subsequent packaging to form microelectronic devices. In this example, each die area includes: (a) one or more electronic components formed on or in the die area's respective portion of the semiconductor substrate and/or in the metallization structure of the processed wafer; and (b) conductive routing structures of the metallization structure to provide external access for electrical interconnection with a probe machine for wafer probing operations.

The first wafer probe testing at 104 can include: (a) application of probe signals to one or more probed electrical connections; and (b) measurement of one or more parameters associated with circuitry of the electronic components of the processed wafer. The example probe test at 104 identifies operability and performance parameters of respective die areas and the associated circuitry thereof. The probe test can identify any malfunctioning circuits. If a die area's respective circuits include features for self-repair (e.g., spare memory cells), then the die area can be identified for subsequent self-repair through additive deposition as described further hereinbelow. For each die area of the processed wafer, the first wafer probe testing 104 collects respective trim or configuration data to identify locations for subsequent additive deposition to set or modify a circuit configuration of the wafer.

At 106, the method 100 further includes depositing a material on the top surface of the wafer (e.g., directly on one or more exposed portions of conductive routing structures and/or on portions of any passivation layer on a top surface of an upper or final metallization structure layer) to set or adjust a circuit of at least one of the electronic components of the processed wafer. The location, dimensions and/or material used in the deposition at 106 is determined at least partially according to (e.g., in response to or based upon) one or more parameters measured during any wafer probe processing portion of 104. In this manner, the measured circuit condition or parameter of the processed wafer is selectively adjusted or set according to the wafer probe results.

At 106, the additive deposition process deposits the material to set or adjust a circuit of variety of different electronic components. Examples of electronic components that can be modified by the deposition at 106 include a capacitor, an inductor, a resistor, an antenna, and a thermal component, or combinations thereof. The deposition processing at 106 includes setting or adjusting at least one dimension of the deposited material to set or adjust the circuit of at least one electronic component of the wafer.

The additive deposition at 106 provides a controlled formation of one or more structures proximate to, or in contact with, conductive routing structures of the wafer metallization structure. The deposition at 106 forms material structures that modify or set a circuit configuration or a component value, or an interconnection or coupling of components in the die.

In various implementations, one or more materials can be deposited at 106, such as electrical conductors, semiconductors, electrically resistive materials, dielectric materials, magnetic materials and/or thermally conductive materials or combinations thereof. The deposited structures can operate as jumpers or resistors, such as extending between exposed portions of first and second conductive routing structures of the metallization structure of the processed wafer. In other examples, the deposited structures extend from an exposed portion of a conductive routing structure to a position proximate (e.g., but not touching) an electrical component or feature of an electrical component to provide electrical shielding, thermal shielding, thermal heat sinking, capacitive or magnetic (e.g., inductive or transformer) coupling between electronic components of the processed wafer. For example, the deposited material structure can be formed over a passivation layer above a conductive routing structure of the metallization structure of a processed wafer to be proximate to, but not touching, a particular conductive routing structure.

In some examples, the deposition at 106 is used to deposit conductors or dielectric materials to selectively set or adjust capacitances in circuits using lateral capacitors formed in the wafer metallization structure. In some examples, the deposition at 106 is performed to deposit magnetic material to selectively set or adjust inductances or magnetic coupling in circuits using planar inductor coil structures formed in the wafer metallization structure. In some examples, the deposition at 106 is used to deposit a resistive material to form a resistor or fuse between exposed portions of the conductive routing structures. The deposition at 106 includes depositing a semiconductor material to form a semiconductor structure between the exposed portion of the first conductive routing structure and the exposed portion of the second conductive routing structure. In further examples, the deposition at 106 includes depositing a thermally conductive material to set or modify the thermal performance of a thermal circuit of the wafer. The additively deposited material forms an ohmic contact to the exposed portion of the conductive routing structure of the metallization layer or layers. The additively deposited material is tailored to create an ohmic contact with a controlled metal-metal interface to the material of the conductive routing structure (e.g., aluminum, copper, etc.) without creating a Schottky diode.

Different additive deposition processes can be performed in different implementations. The deposition at 106 includes performing a printing process or other additive deposition process to form the deposited material. In some implementations, the deposited material is a solution made of dissolved particles suitable for spray deposition. The printing process at 106 is an ink jet process. In another example, the printing process at 106 is an electrostatic jet process. In another example, the printing process at 106 is a jet dispense process. In another example, the printing process at 106 is a laser assisted deposition process. In another example, the printing process at 106 is a spray process. In another example, the printing process at 106 is a screen printing process. Multiple printing processes are performed at 106, such as to deposit multiple different materials in different locations on the wafer surface 129. The process at 106 deposits a solution that includes metal (e.g., nanoparticle, sol-gel, metal salt decomposition). The deposition process at 106 deposits resistive material (e.g., carbon-containing material (and all allotropes), a polymer filled with carbon/conductive particles, a deposited metal solution). The deposition process at 106 deposits dielectric material (e.g., high dielectric constant (high-K) materials, such as polymers including PI, PBO, BCB, SUB, Epoxy, sol-gel ceramic materials that include HBN, oxides, barium titanate). The deposition process at 106 deposits magnetic material (e.g., iron oxide, Ni, Co, Magnetite). The deposition process at 106 deposits thermal transport modifying material (e.g., high thermal constant (high thermal K) materials, such as graphene, CNT, HBN, deposited metal solutions, ceramics).

In the example method 100 of FIG. 1, a cure process is performed at 108 to cure the material deposited at 106. The processing at 108 includes pre-baking the wafer and exposing the deposited material to ultraviolet (UV) light to facilitate drying and establishing a desired material property of the deposited material. In other implementations, the optional cure processing at 108 can be omitted.

The example method 100 of FIG. 1 includes performing a second wafer probe test at 110 after the additive deposition processing at 106. The second wafer probe test at 110 measures the circuit parameter or parameters that were tested in the first wafer probe at 104 for the circuit of at least one electronic component of the wafer. Further additive deposition can be performed along with any cure processing portion of 106 and 108, according to (e.g., in response to or based upon) the results of the second wafer probe test at 110. In other examples, the second wafer probe processing at 110 can be omitted. In another example, the material printed at 106 creates a structure: (a) between two conductive routing structures; and (b) therefore, between electrical components that are respectively connected to those two conductive routing structures. All or a portion of the additively deposited material can be removed, such as by laser trimming at 112, to adjust the circuitry of the electronic components. For example, a resistive material can be additively deposited with an initial width at 106, and thereafter laser trimming can be used at 112 to narrow the deposited resistive material, thereby increasing the resistance. The initial wafer probe operations at 104 and/or the subsequent wafer probe processing at 110 includes an optical probe to identify topographic features of the top surface of the processed wafer, and the additive deposition processing at 106 is adjusted to preferentially deposit material structures (e.g., conductive material, resistive material, semiconductor material, etc.) in the identified valleys or low-lying areas of the top surface. Accordingly, some fabrication processes at 102 include planarizing the top surface, and other wafer fabrication processing at 102 omits topside planarization processing, leaving high and low topographic features on the top surface. In some implementations, the additive deposition at 106 preferentially deposits material in low-lying regions between steps on the top surface. In one implementation, the low-lying regions are identified through optical wafer probing at 104 and/or 110.

Following the configuration processing at 103 (e.g., steps 104-110 in FIG. 1), the example manufacturing method 100 includes assembly processing at 112. The assembly processing includes one or more of back grinding the processed wafer, sawing or laser cutting the wafer to singulate the wafer into separate dies that include respective circuits formed by the electronic components, die attach processing to attach each die to a respective lead frame, wire bonding to attach bond wires to the die and lead frame features, cleaning processes, such as a plasma cleaning step (e.g., $Ar/O_2$), and packaging, such as molding operations to form a finished microelectronic device (e.g., packaging to provide a microelectronic device having an integrated circuit). At 114, final testing is performed to verify operation of the finished microelectronic device. The assembly processing at 112 includes forming a passivation layer (not shown) over the top surface, to cover all or at least a portion of the additively deposited material formed at 106. If the deposited material includes silver, then the formation of an additional passivation layer over the additively deposited silver facilitates prevention or mitigation of silver migration. The subsequently formed passivation material can be deposited using any suitable process, including additive deposition (e.g., printing), chemical vapor deposition (CVD) to deposit a nitride or oxynitride passivation material, etc.

Figure 2:
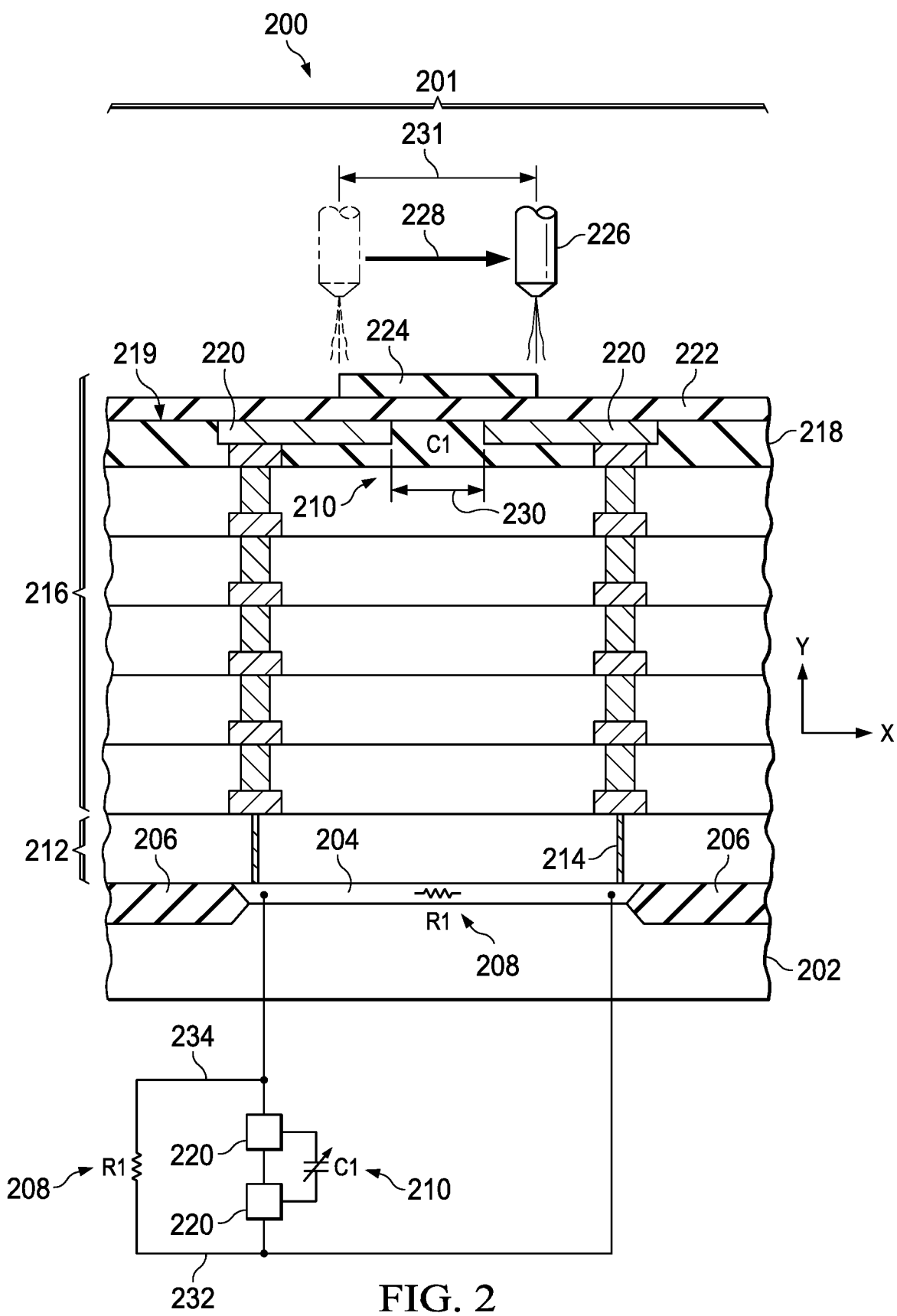
FIG. 2 is a partial side elevation view of a processed wafer with a dielectric material additively deposited over a metallization structure to set or adjust a circuit that includes a lateral capacitor formed in the metallization structure.

FIG. 2 shows an example microelectronic device during manufacturing according to the example method 100. An illustrative portion of a processed wafer 200 is shown in FIG. 2, including one example illustrated die portion or die area 201. The example wafer 200 is processed as a unitary structure, including the example additive deposition processing (e.g., 106 in FIG. 1 hereinabove), and subsequently singulated into separate dies 201. The device in FIG. 2 includes a semiconductor substrate 202 (e.g., a silicon wafer, SOI wafer, etc.), and a number of electronic components are formed on or in the substrate 202. In the illustrated example, polysilicon structures 204 are formed over and upper surface of the substrate 202. Isolation structures 206 (e.g., field oxide structures, shallow trench isolation (STI) structures, etc.) are formed to isolate selected regions or areas of the substrate 202. One or more portions of the substrate 202 and/or of the polysilicon structures 204 are selectively implanted with p or n-type impurities or dopants (not shown) using suitable semiconductor processing techniques and apparatus to form one or more electronic components. A polysilicon structure 204 provides a polysilicon resistor 208 (e.g., labeled R1). Other types and forms of electronic components can be formed on or in the substrate 202, and in subsequently-formed metallization structures 212, 216, such as resistors, inductors, capacitors, etc.

A metallization layer 212 is formed over the upper surface of the substrate 202, the polysilicon structures 204 and the isolation structures 206. The metallization layer or level 212 is referred to as a pre-metallization dielectric (PMD) layer, and can be any suitable dielectric material, such as silicon dioxide ($SiO_2$). Conductive contacts 214 are formed of suitable conductive material (e.g., tungsten (W), copper (Cu), etc.) through the PMD layer 212 to form ohmic conductive contacts to select portions of the electronic component 208. One or more additional metallization layers, referred to as inter-layer dielectric (ILD) layers, are formed over the PMD layer 212 to provide a single or multi-layer structure 216. The metallization structure 212, 216 includes a final or uppermost ILD dielectric layer 218 with a top or upper surface 219.

The ILD layers 216 include conductive routing structures to form interconnections through associated PMD layer contacts 214 to interconnect various electronic components of the wafer 200 to one another, and to provide external connectivity to various ones of the electronic component features. Conductive routing structures 220 (e.g., copper) have upper surfaces exposed through the top or upper surface 219 of a final ILD layer 218. The illustrated example includes a passivation layer 222 (e.g., a nitride material) formed over select portions of the top ILD layer 218. The passivation layer 222 exposes portions of the tops of the illustrated conductive routing structures 220. In other examples, the passivation layer 222 covers all or portions of the upper conductive routing structures 220.

In the example of FIG. 2, the metallization structure 212, 216 includes first and second conductive routing structures 220 electrically connected to opposite ends of the resistor 208. The illustrated first and second upper conductive routing structures 220 form capacitor plates of a lateral capacitor 210 (e.g., labeled C1 in the drawing). The upper ILD layer 218 provides a dielectric material between the conductive routing structures 220 to form the capacitor 210 in parallel with the polysilicon resistor structure 208. Performing the additive deposition process at 106 in FIG. 1 deposits a dielectric material 224 over the surface 219 of the top dielectric layer 218 to set or adjust the parallel RC circuit of the resistor 208 and the capacitor 210. In the example of FIG. 2, the capacitor plates 220 are laterally spaced from one another by a gap distance 230.

The presence or absence of the selectively deposited dielectric material 224 proximate the gap 230 affects (e.g., sets or adjusts) the capacitance C1 of the capacitor 210. Also, the selected material 224 impacts the final capacitance C1. Also, the dimensions (along the illustrated X and/or Y directions, and the extent along the direction into the page in FIG. 1) affects the capacitance C1. In various implementations, the additive deposition at 106 is selectively adjusted to control the dimensions, material, and/or the presence/absence of the added structure 224 in order to set or adjust the capacitance C1 of the capacitor 210. This deposition, in turn, sets or adjusts the parallel RC circuit formed by the capacitor component 210 and the resistor component 208. In this example, a deposition system translates a print head or spray nozzle 226 from left to right along the direction 228 in FIG. 2, in order to deposit the material 224.

FIG. 2 also schematically shows the resulting RC parallel circuit, including the resistor 208 (R1) in parallel with the capacitor 210 (C1). In this example, the resistor 208 and the capacitor 210 are connected in parallel with one another between circuit nodes 232 and 234 by the interconnection of the metallization conductive routing structures 220. The capability of providing the additive deposition of the dielectric material 224 provides adjustability of the capacitor 210 as schematically shown in FIG. 2.

Figure 3:
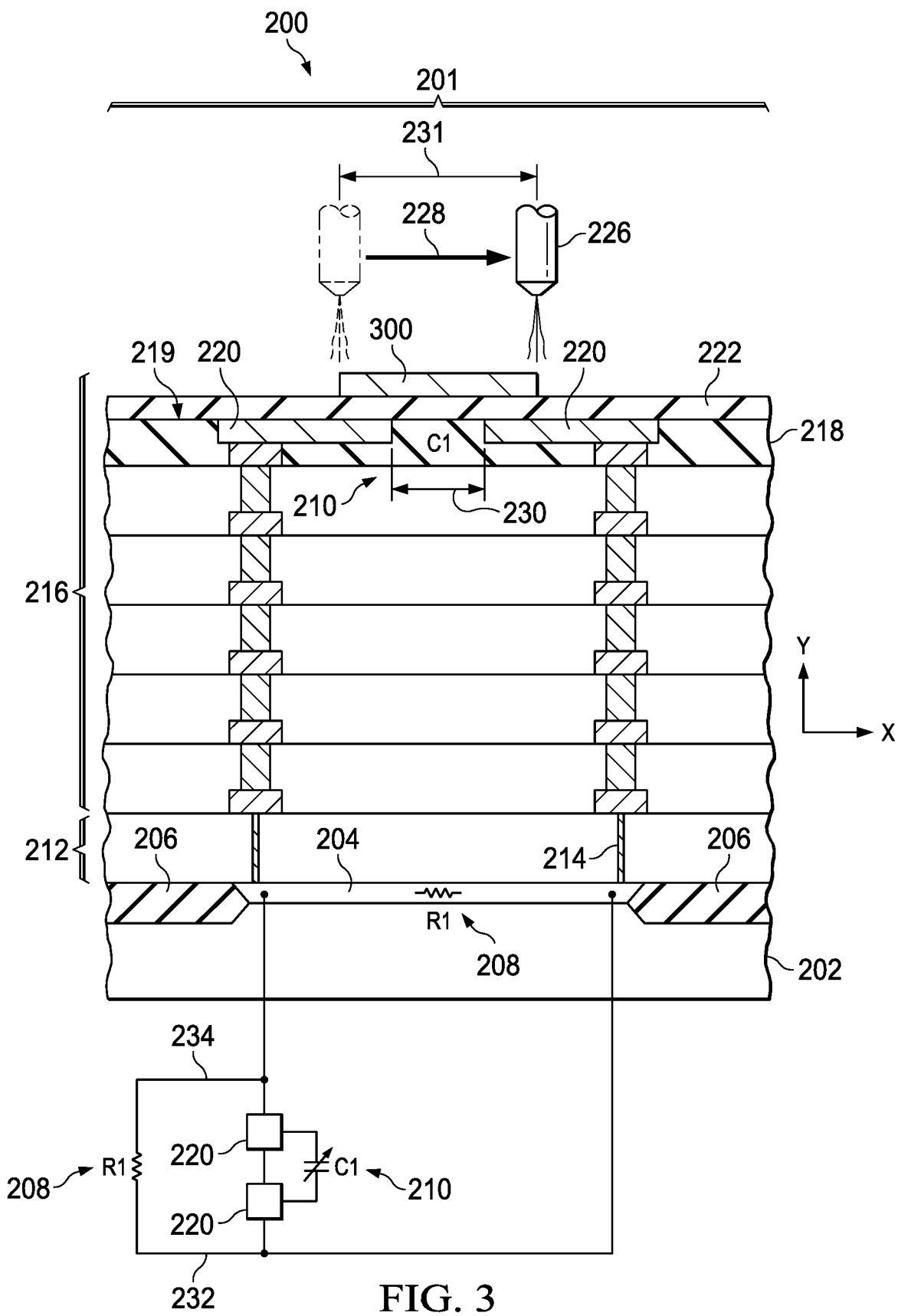
FIG. 3 is a partial side elevation view of a processed wafer with a conductive material additively deposited over a metallization structure to set or adjust a circuit that includes a lateral capacitor formed in the metallization structure.

FIG. 3 shows another implementation of the example microelectronic device 200 during manufacturing according to the example method 100. In this example, the additive deposition process at 106 in FIG. 1 deposits a conductive material structure 300 over the metallization structure to set or adjust the circuit that includes the lateral capacitor 210 of the metallization structure 212, 216. As shown in FIG. 3, conductive structure 300 is floating relative to the circuit components 208 and 210. In this example, the presence of the conductive structure 300 (e.g., copper) provides mutual capacitance adjustment capabilities with respect to the capacitance C1 of the capacitor 210. In another example, the additive deposition process at 106 creates a conductive structure 300 that is near the gap 230 between the capacitor plates of the capacitor 210, and the added conductive structure 300 is also connected to another conductive routing structure of the metallization structure (not shown) to control the voltage of the conductive material structure 300. For example, the conductive structure 300 can be grounded, or can be connected to a supply voltage node within the circuitry to influence the capacitance C1 in a controllable manner.

The examples of FIGS. 2 and 3 facilitate wafer scale deposition of dielectric or conductive material proximate (e.g., over) the conductive routing structures 220 that form the plates of the capacitor 210 to change the value of the capacitance C1, while the intervening portions of the passivation layer 222 prevent short-circuiting of the capacitor plates by the additive deposition of the material structure 300. This adjustment capability can be used in an analog manner to tune the capacitor and/or in a digital fashion to trim a function on the subsequently singulated and packaged microelectronic device.

The manufacturing and configuration methods 100, 103 in FIG. 1 are useful in various ways to trim or adjust circuits, such as to create a radio frequency (RF) jumper without the use of an Ohmic contact. Another advantageous use is to route an RF signal without the use of an ohmic contact. This technique can also be used to tune an RF filter on a part by part basis by changing or setting a capacitance of a capacitor component of a filter circuit, whether the capacitor is created at least partially on or in the underlying substrate 202, or at least partially created in the metallization structure 212, 216. The described methods can also be used to create different products based on a single wafer design, such as by adjusting the additive deposition processing at 106 on a die-by-die basis. In this manner, the deposition processing at 106 can provide different filter frequencies, RF power output, single ended versus differential signal paths, etc., on different die areas 201 within a single wafer 200.

Figure 4:
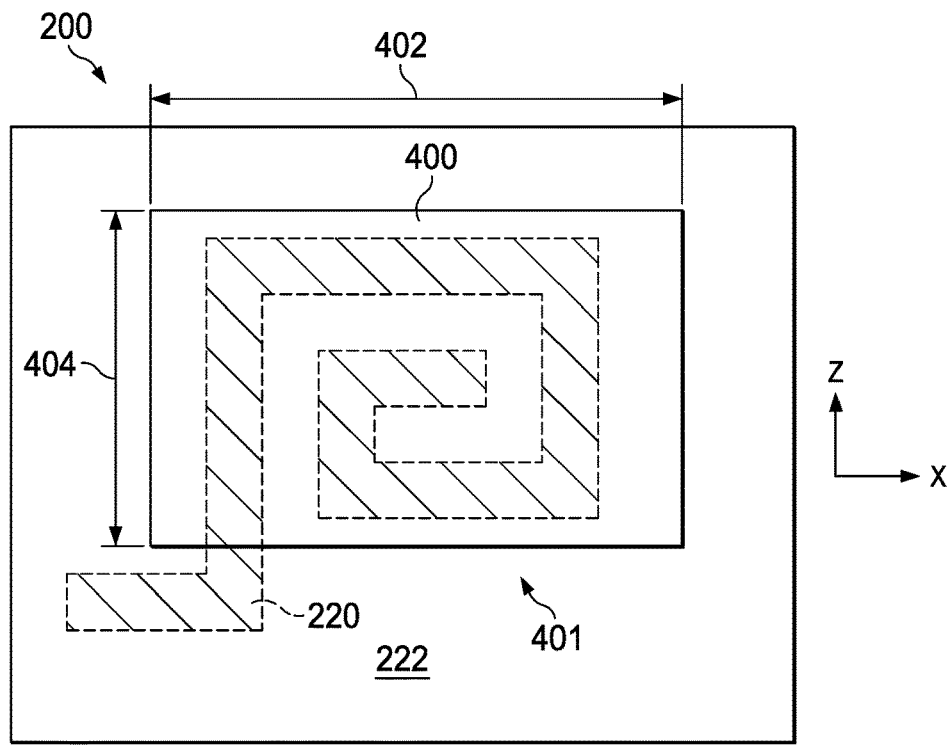
FIG. 4 is a partial top plan view of a processed wafer with a magnetic material deposited over a metallization structure to set or adjust a circuit that includes a planar inductor formed in the metallization structure.

FIG. 4 shows a partial top view of another example of the processed wafer 200 with a magnetic material 400 deposited over the metallization structure (e.g., over a portion of the passivation layer 222) at 106 in the method 100 of FIG. 1. The deposited magnetic material 400 in this example includes a length 402, a width 404, and a thickness (not shown, out of the page in FIG. 4) which can be controlled by the additive deposition processing at 106. In this example, the additive deposition of the magnetic material 400 sets or adjusts a circuit that includes a planar inductor 401 formed in the metallization structure. The additive deposition in this example deposits the magnetic material 400 over the surface 219 of the dielectric layer 218. The inductor 401 in this example is a planar coil with first and second ends that can be connected to other circuitry in the wafer 200 using conductive routing structures of different metallization structure levels or layers (not shown).

Figure 5:
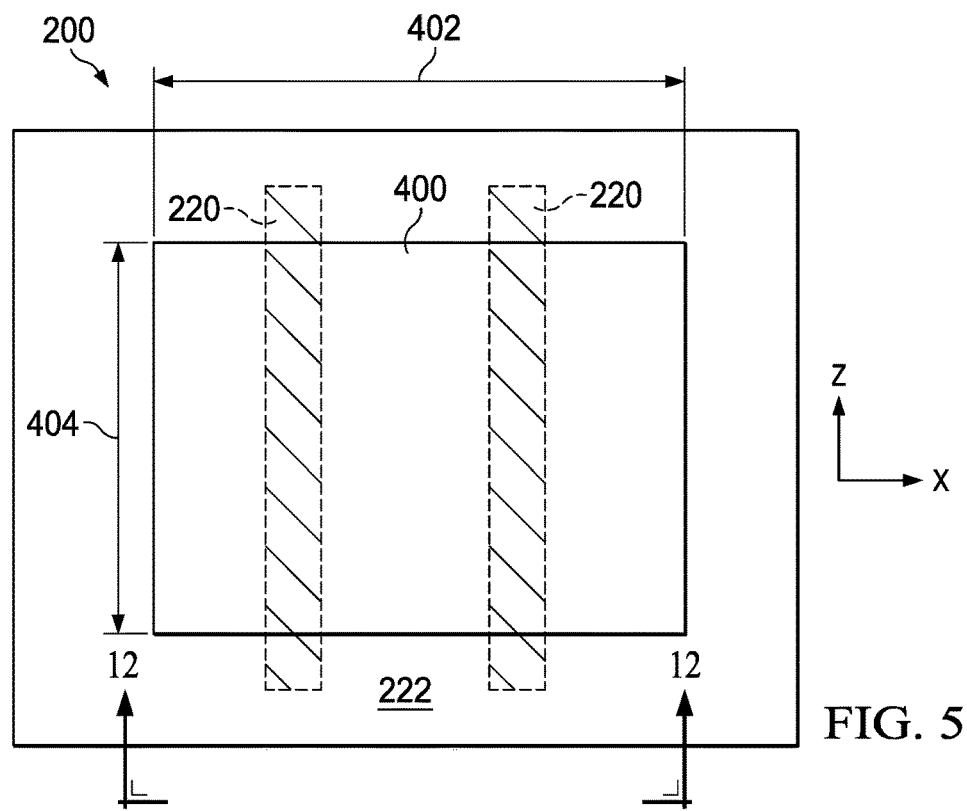
FIG. 5 is a partial top plan view of a processed wafer with a magnetic material deposited over a metallization structure to set or adjust a magnetic coupling between two conductive features formed in the metallization structure.

FIG. 5 shows a partial top view of yet another example of the processed wafer 200. In this example, two generally parallel conductive routing structures 220 of the top metallization structure layer 218 (e.g., FIG. 2 described hereinabove) are magnetically coupled with one another by the additive deposition (e.g., 106 in FIG. 1) of the magnetic material 400. This capability allows selective magnetic (e.g., inductive) coupling of first and second circuits by selective placement of magnetic material 400 proximate conductive features 220 of two different circuits within the wafer 200. In this example, the additive deposition at 106 facilitates setting or adjusting coupling between two circuits of a given die area by the absence/presence of additively deposited magnetic material 400 and/or by the adjustment of the constituents of the material 400, the length 402, the width 404 and/or the thickness of the deposited material 400.

Figure 6:
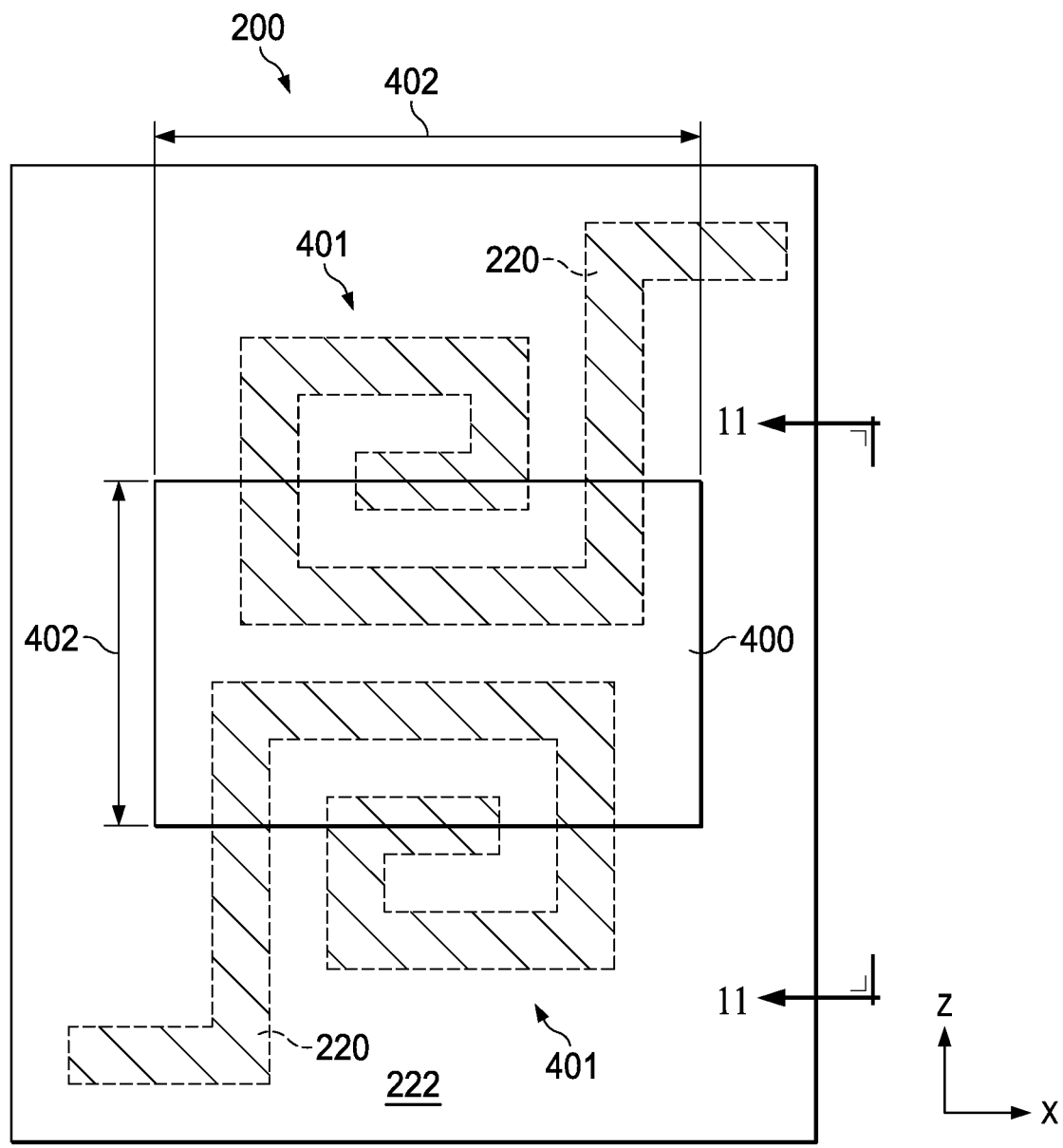
FIG. 6 is a partial top plan view of a processed wafer with a magnetic material deposited over a metallization structure to set or adjust magnetic coupling between first and second planar inductors formed in the metallization structure.

FIG. 6 shows another partial top plan view of different implementation of the processed wafer 200 using selective additive deposition of magnetic material 400. In this example, the processed wafer 200 includes two separate planar coil inductor structures 401 formed by conductive routing structures 220 in the top metallization layer 218. The additive deposition at 106 in FIG. 1 in this example deposits the magnetic material 400 over the metallization structure (e.g., over the passivation layer 222) to set or adjust magnetic coupling between the first and second planar inductors 401 formed in the metallization structure. In one implementation, the addition of the magnetic material 400 provides transformer coupling between the first and second coils 401. The concept of FIG. 6 can be extended to selectively couple or vary the amount of coupling between different inductors in a bank of inductors by selective additive deposition of magnetic material between or proximate conductive features of those different inductors. This facilitates fine-tuning of an inductance in any desired circuit application.

The examples of FIGS. 4-6 allow the additive deposition at 106 to implement magnetic jumpers in select die circuits over conductive routing structures 220 for coils 401 to change the magnetic coupling or self-inductance of an inductor, to selectively create transformer couplings, to tune one or more parameters of the circuit that includes an inductor or transformer, to create a digital switch with a force/sense circuit, and/or other applications.

Figure 7:
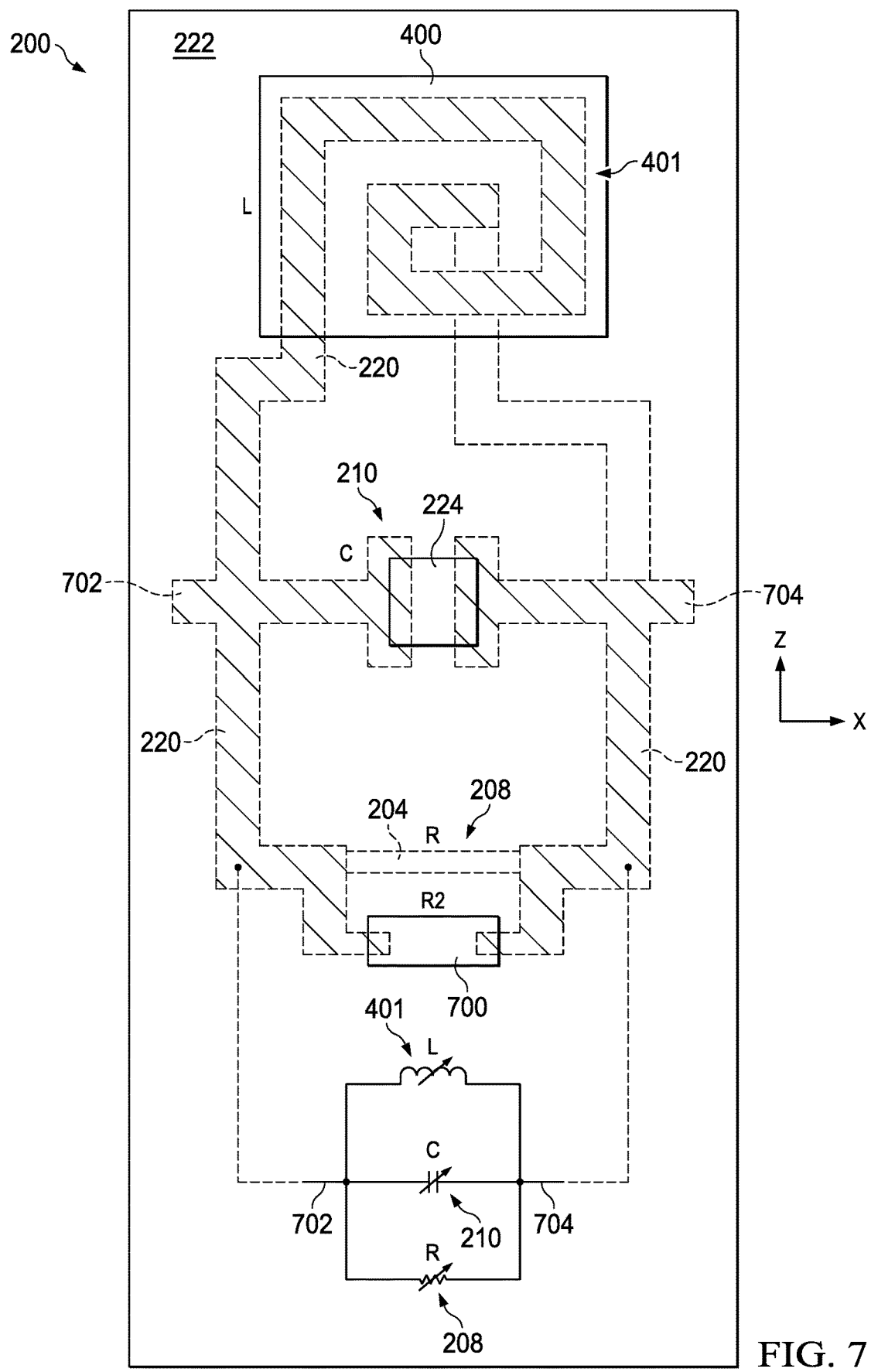
FIG. 7 is a partial top plan view of a processed wafer with magnetic, conductive, dielectric and/or resistive material deposited over a metallization structure to set or adjust a parallel RLC tank circuit with components formed in the metallization structure.

FIG. 7 shows a partial top plan view of different implementation of the processed wafer 200, including an RLC resonant tank circuit formed by a resistor 208 (labeled R), a capacitor 210 (labeled C) and an inductor 401 (labeled L). Various portions of the circuit components are formed by conductive routing structures 220 to form a first circuit node 702 and a second circuit node 704. In this example, the processed wafer 200 includes an inductor coil 401 with a first end connected to the first node 702, and a second end connected to the second node 704 through metallization structure routing in a lower metallization layer or level (shown in dashed lines in FIG. 7).

The conductive routing structures 220 also form generally parallel capacitor plates of a lateral capacitor 210 (e.g., similar to FIGS. 2 and 3 described hereinabove). The illustrated lower portions of the conductive routing structures 220 (e.g., nodes 702 and 704) are connected through conductive features (not shown) of the metallization structure to first and second ends of the polysilicon resistor 208 (e.g., FIGS. 2 and 3 described hereinabove). In this example, the additive deposition processing at 106 in FIG. 1 is used to selectively deposit magnetic, conductive, dielectric and/or resistive material over the metallization structure to set or adjust the resonant frequency of the parallel RLC tank circuit created by electronic components formed in the metallization structure and the substrate 202. As described hereinabove in connection with FIGS. 4-6, a deposited magnetic material structure 400 is used to set or adjust an inductance L of the inductor component 401. Also, a deposited dielectric material structure 224 (or a deposited conductive structure) is used to set or adjust the capacitance C of the capacitor component 210 (e.g., FIGS. 2 and 3 described hereinabove).

Also, the additive deposition process deposits a resistive material 700 over the surface 219 of the dielectric layer 218 to set or adjust the resistance of the resistor component 208. In this example, the deposited resistive structure 700 adds a resistance R2 in parallel with a resistance R of the polysilicon structure 204 to modify or set the resistance of the resonant tank circuit. Moreover, the presence or absence, and the dimensions and materials, of the deposited structures 400, 224 and/or 700 can be adjusted in the additive deposition processing at 106 to achieve any desired resonant frequency or other operating parameter of the circuit.

Figure 8:
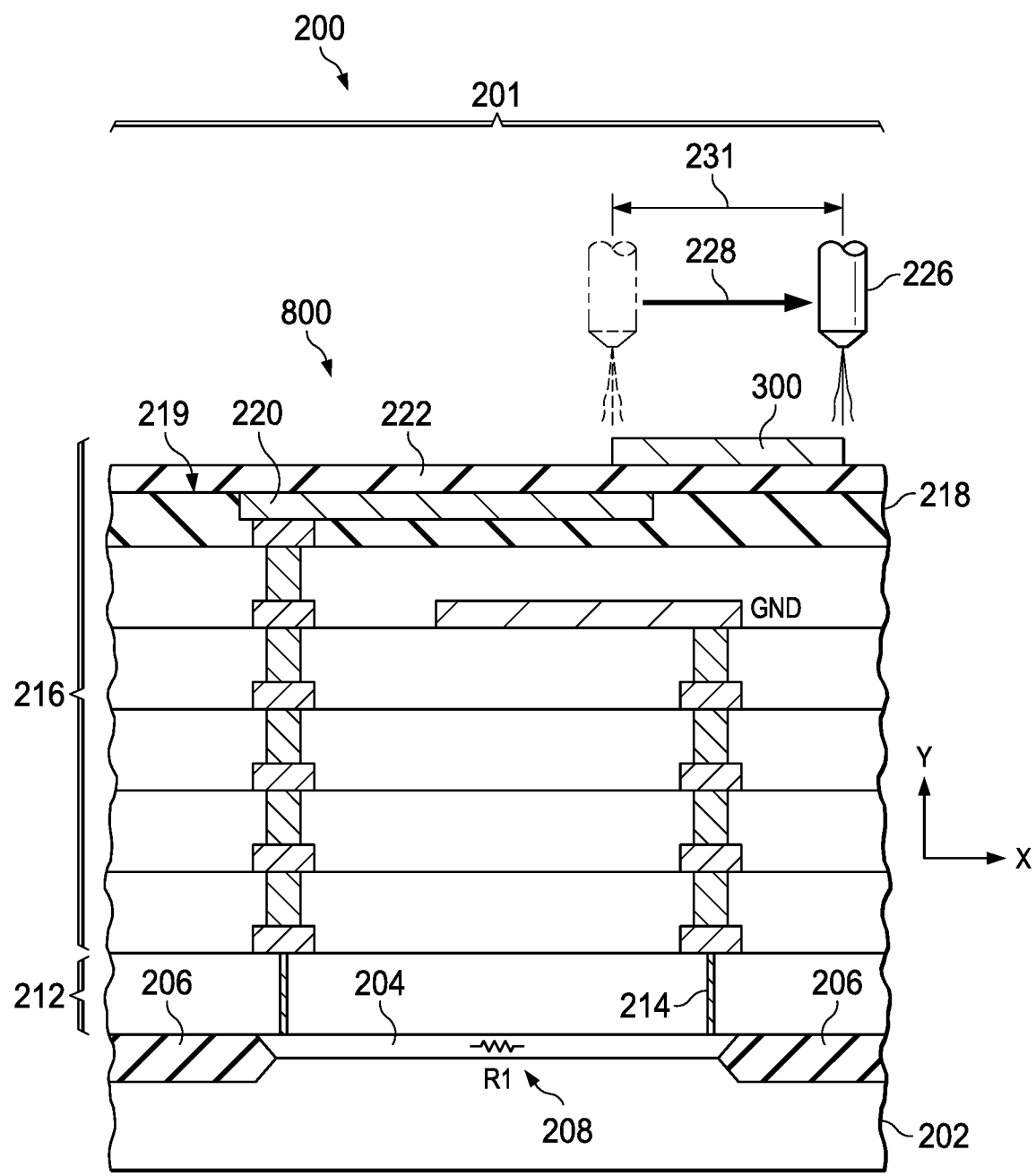
FIG. 8 is a partial side elevation view of a processed wafer with a conductive material deposited over a metallization structure to set or adjust an antenna circuit formed in the metallization structure.
Figure 9:
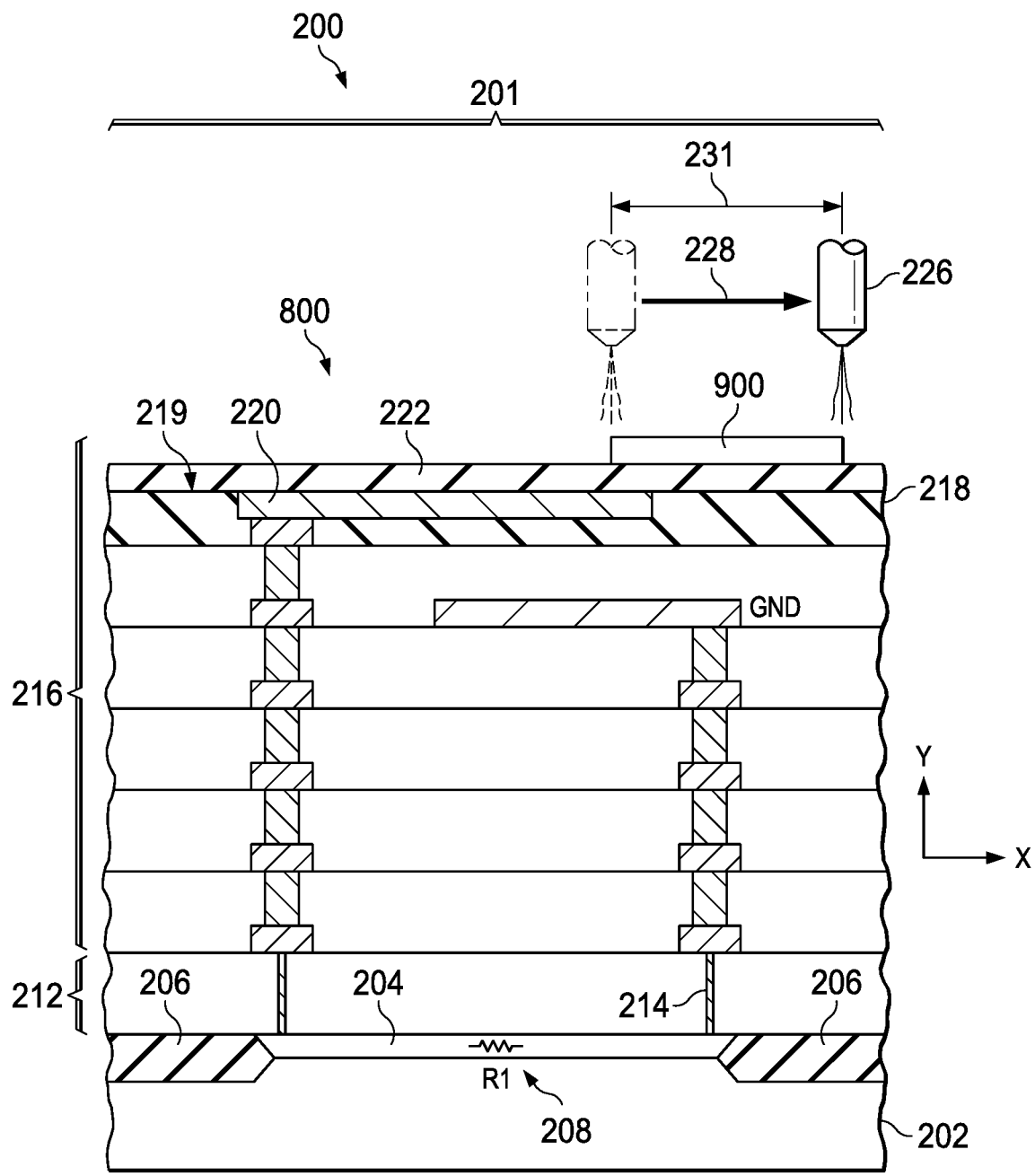
FIG. 9 is a partial side elevation view of a processed wafer with a semiconductor material deposited over a metallization structure to set or adjust an antenna circuit formed in the metallization structure.

Referring to FIGS. 8 and 9, FIG. 8 shows another implementation of the processed wafer 200 with additive deposition processing used to implement a configurable RF tuning stub of a programmable electrical length for an antenna circuit. In this example, a top metallization layer conductive routing structure 220 forms a base antenna 800 that is connected in series with the above-described polysilicon resistor 208 (labeled R1). One end of the resistor 208 is connected to a ground reference node via a metallization structure interconnection (e.g., labeled GND). In the example of FIG. 8, a conductive material structure 300 is deposited over the metallization structure (e.g., proximate to the antenna 800, and electrically separated from the antenna 800 by the intervening passivation layer 222). The dimensions of the additively deposited conductive structure 300 facilitate setting or adjusting the antenna circuit formed in the metallization structure. FIG. 9 shows another example RF tuning stub implementation of the processed wafer 200, where a semiconductor material 900 is additively deposited over the metallization structure 212, 216 to set or adjust the antenna circuit formed in the metallization structure.

Figure 10:
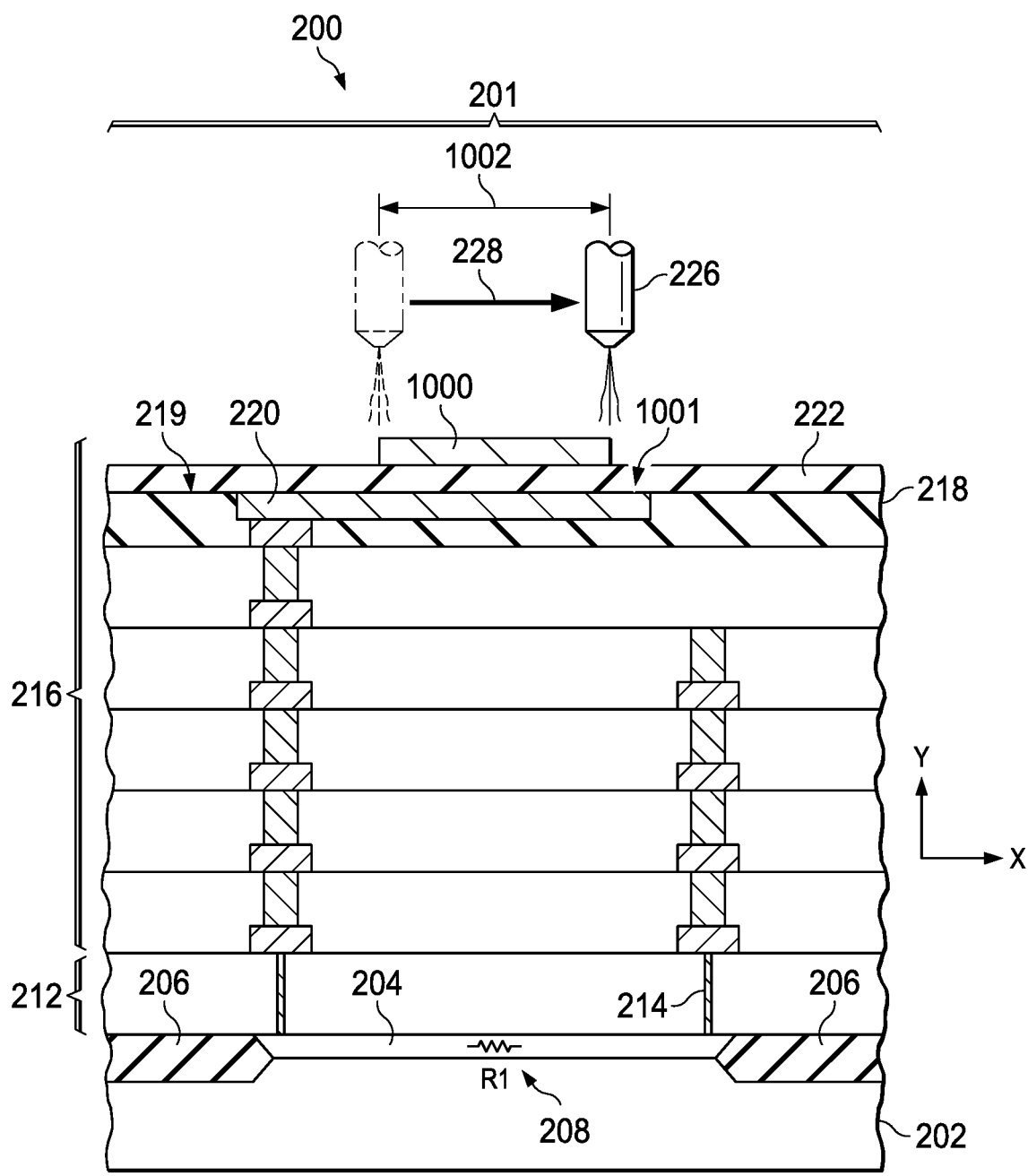
FIG. 10 is a partial side elevation view of a processed wafer with a thermally conductive material deposited over a metallization structure to set or adjust a thermal circuit formed in the metallization structure.

FIG. 10 shows another implementation of the processed wafer 200 to illustrate additive deposition to set or adjust thermal circuitry. In this example, the processed wafer 200 includes a thermally conductive material 1000 deposited over a thermal circuit component of the metallization structure (e.g., shown as a conductive routing structure 220). The presence or absence, dimension, proximity, and thermal conductivity parameter (e.g., thermal K) of the deposited material 1000 modifies the thermal transfer into or out of the thermal circuit to set or adjust the thermal circuit formed in the metallization structure. The described additive deposition methods and techniques are useful to modify thermal conductivity of a thermoelectric circuit, to tune a thermal time constant, to tune the efficiency of phonon transfer and a circuit of the wafer 200, or for other purposes.

Figure 11:
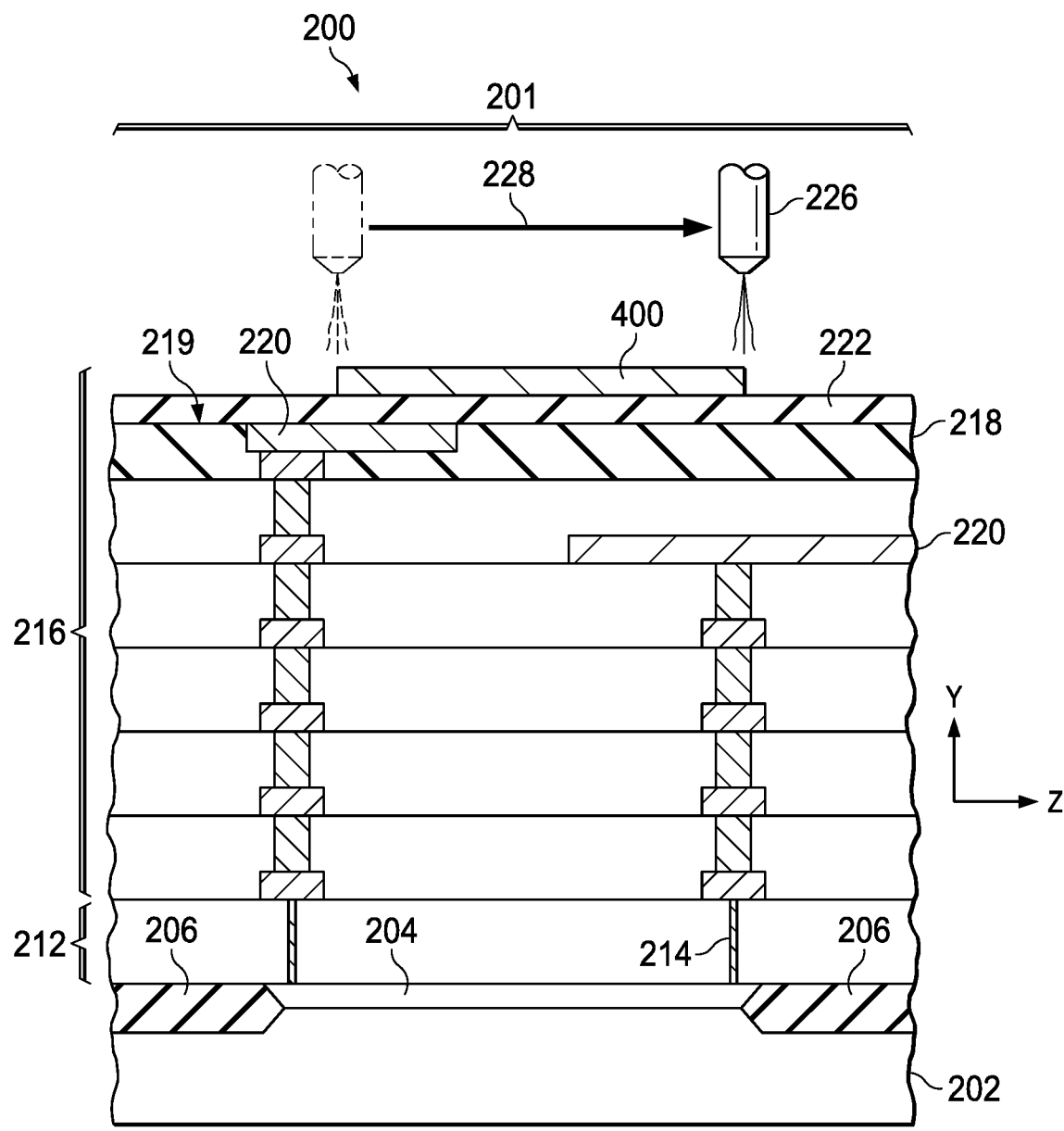
FIG. 11 is a partial sectional side elevation view taken along line 11-11 of FIG. 6 of an example processed wafer with a with a magnetic material deposited over the metallization structure to set or adjust magnetic coupling between first and second planar inductors formed at different levels in the metallization structure.

FIG. 11 shows another implementation of the processed wafer 200 taken along line 11-11 of FIG. 6 to illustrate additive deposition to magnetically couple two planar inductors formed at different levels in the metallization structure 212, 216. In this example, the processed wafer 200 includes first and second planar inductors formed at different levels in the metallization structure 212, 216, and the additive deposition of the magnetic material 400 over the metallization structure (e.g., over the passivation layer 222) magnetically couples the inductors.

Figure 12:
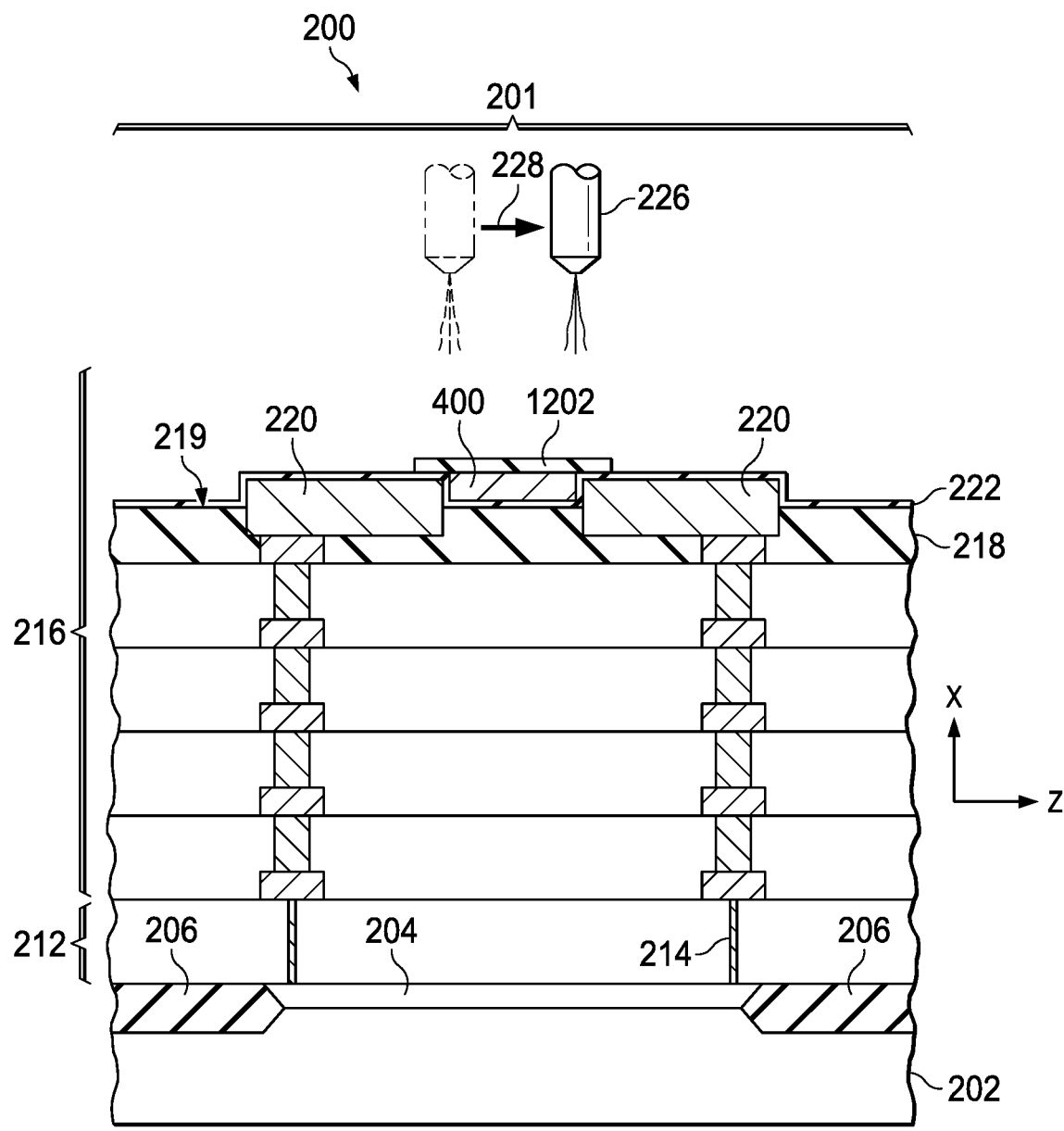
FIG. 12 is a partial sectional side elevation view taken along line 12-12 of FIG. 5 of another example processed wafer with a with a magnetic material deposited in low-lying areas of the top surface over the metallization structure to set or adjust magnetic coupling between first and second conductive features formed in the metallization structure.

FIG. 12 shows another implementation of another example processed wafer 200 taken along line 12-12 of FIG. 5 to illustrate additive deposition to magnetically couple two conductive features formed in the metallization structure 212, 216. In this example, the top surface of the process wafer 200 includes topographic features with a textured surface including high and low-lying areas. In this example, moreover, the passivation layer 222 is a generally conformal thin layer, with the upper metallization conductive structures 220 extending vertically over portions of the passivation layer 222. An optical wafer probe (e.g., at 104 and/or 110 in the method 100 of FIG. 1) identifies a low-lying region (e.g., a Valley) between the conductive structures 220 of the top metallization layer 218. In this case, the additive deposition processing at 106 forms magnetic material 400 and the low-lying region laterally between the conductive structures 220. This example provides advantages in selective additive deposition of the magnetic material 400 to selectively magnetically couple circuitry of the processed wafer 200 and/or to modify an inductance or other performance attribute of the circuitry. Moreover, a further passivation layer material 1202 is formed over at least a portion of the additively deposited magnetic material 400 following the deposition processing at 106. In another example of this concept, dielectric material can be deposited in valleys or low-lying areas laterally between conductive routing structures to form a capacitor or provide capacitive coupling, with intervening passivation layer material. This approach can be combined with optical scanning (e.g., at 104 and/or 110) to identify the location of low-lying regions between finger structures, and may be further combined with electrical wafer probe measurements to adjust the thickness and/or location of the additively deposited materials to precisely adjust or set electrical component values, the amounts of magnetic or capacitive coupling, or other features or performance attributes of the circuitry of the processed wafer 200.

Figure 13:
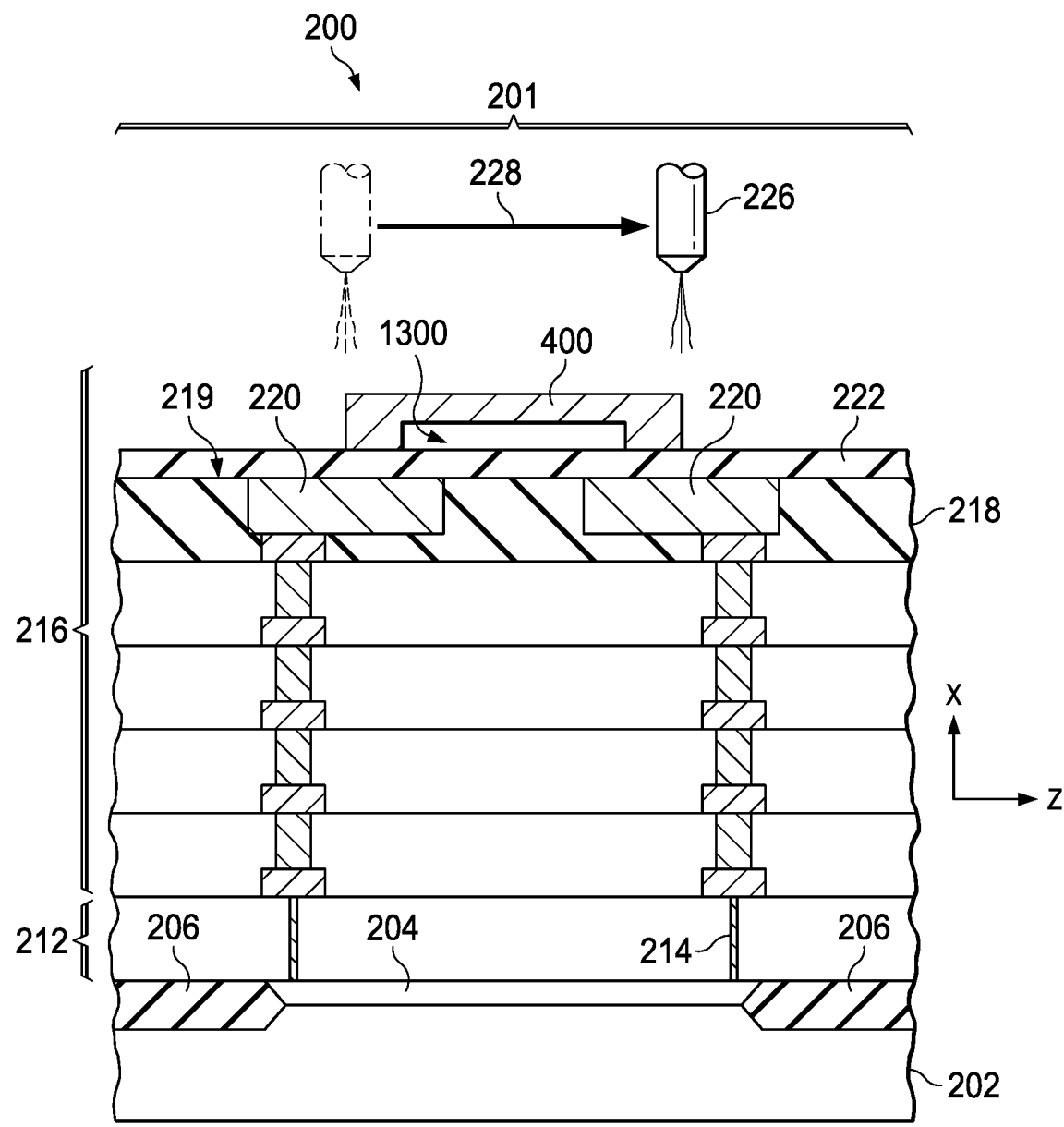
FIG. 13 is a partial sectional side elevation view taken of another example processed wafer with a with a magnetic material formed through additive three-dimensional deposition over the metallization structure to set or adjust magnetic coupling between first and second conductive features formed in the metallization structure.

FIG. 13 shows another example processed wafer with a with a three-dimensional magnetic material 400 formed by additive deposition over the metallization structure 212, 216 to set or adjust magnetic coupling between first and second conductive structures 220 formed in the metallization structure. In the illustrated example, the magnetic material structure 400 includes a gap or cavity 1300. In one possible implementation, a metallization structure (not shown) is formed over the three-dimensional magnetic material 400 to provide a conductive shield.

Modifications are possible in the described embodiments, and other embodiments are possible, within the scope of the claims.

What is claimed is:

1. A method of manufacturing an integrated circuit, the method comprising:
    fabricating a wafer, including a semiconductor substrate and a metallization structure over the semiconductor substrate, the metallization structure including: a dielectric layer with a surface, a conductive routing structure, and electronic components;
    performing an additive deposition process that deposits a material over the surface of the dielectric layer to set or adjust a circuit of at least one of the electronic components, in which the additive deposition process includes: an ink jet process, an electrostatic jet process, a jet dispense process, a laser assisted deposition process, a spray process, or a screen printing process; and
    singulating the wafer into separate dies, including a die that includes the circuit.

2. The method of claim 1, further comprising:
    before performing the additive deposition process, forming a passivation layer over at least a portion of the surface of the dielectric layer.

3. The method of claim 1, further comprising:
    before performing the additive deposition process, performing a wafer probe test that measures a parameter of the circuit; and
    performing the additive deposition process to set or adjust the circuit according to the parameter.

4. The method of claim 3, wherein the wafer probe test is a first wafer probe test, and the method further comprises:
    after performing the additive deposition process, performing a second wafer probe test that measures the parameter of the circuit.

5. The method of claim 1, wherein performing the additive deposition process deposits a dielectric material over the surface of the dielectric layer or deposits a conductive material over the surface of the dielectric layer to set or adjust at least one capacitor of the electronic components.

6. The method of claim 5, wherein performing the additive deposition process deposits a magnetic material over the surface of the dielectric layer to set or adjust at least one inductor of the electronic components.

7. The method of claim 6, wherein performing the additive deposition process deposits a resistive material over the surface of the dielectric layer or deposits a conductive material over the surface of the dielectric layer to set or adjust at least one resistor of the electronic components.

8. The method of claim 1, wherein performing the additive deposition process deposits a conductive material over the surface of the dielectric layer or deposits a semiconductor material over the surface of the dielectric layer to set or adjust at least one antenna of the electronic components.

9. The method of claim 1, further comprising setting or adjusting at least one dimension of the deposited material to set or adjust the circuit.

10. A method of manufacturing an integrated circuit, the method comprising:
    fabricating a wafer, including a semiconductor substrate and a metallization structure over the semiconductor substrate, the metallization structure including: a dielectric layer with a surface, a conductive routing structure, and electronic components;
    performing an additive deposition process that deposits a magnetic material over the surface of the dielectric layer to set or adjust at least one inductor of the electronic components; and
    singulating the wafer into separate dies, including a die that includes the circuit.

11. The method of claim 10, wherein performing the additive deposition process deposits a resistive material over the surface of the dielectric layer or deposits a conductive material over the surface of the dielectric layer to set or adjust at least one resistor of the electronic components.

12. A method of manufacturing an integrated circuit, the method comprising:
    fabricating a wafer, including a semiconductor substrate and a metallization structure over the semiconductor substrate, the metallization structure including: a dielectric layer with a surface, a conductive routing structure, and electronic components;
    performing an additive deposition process that deposits a resistive material over the surface of the dielectric layer or deposits a conductive material over the surface of the dielectric layer to set or adjust at least one resistor of the electronic components; and
    singulating the wafer into separate dies, including a die that includes the circuit.

13. A method of manufacturing an integrated circuit, the method comprising:
    fabricating a wafer, including a semiconductor substrate and a metallization structure over the semiconductor substrate, the metallization structure including: a dielectric layer with a surface, a conductive routing structure, and electronic components;
    performing an additive deposition process that deposits a thermally conductive material over the surface of the dielectric layer to set or adjust at least one thermal component of the electronic components; and
    singulating the wafer into separate dies, including a die that includes the circuit.

14. A method of configuring an integrated circuit, the method comprising:

providing a processed wafer including a semiconductor substrate and a metallization structure over the semiconductor substrate, the metallization structure including: a dielectric layer with a surface, a conductive routing structure, and electronic components; and performing an additive deposition process that deposits a material over the surface of the dielectric layer to set or adjust a circuit of at least one of the electronic components, in which the additive deposition process includes: an ink jet process, an electrostatic jet process, a jet dispense process, a laser assisted deposition process, a spray process, or a screen printing process.

15. The method of claim 14, further comprising:

before performing the additive deposition process, performing a wafer probe test that measures a parameter of the circuit; and performing the additive deposition process to set or adjust the circuit according to the parameter.

16. The method of claim 15, wherein the wafer probe test is a first wafer probe test, and the method further comprises:

after performing the additive deposition process, performing a second wafer probe test that measures the parameter of the circuit.

17. The method of claim 14, wherein performing the additive deposition process deposits the material to set or adjust a capacitor, an inductor, a resistor, an antenna, or a thermal component.

* * * * *